United States Patent
Yan et al.

(10) Patent No.: US 10,754,585 B2
(45) Date of Patent: Aug. 25, 2020

(54) METHOD FOR PERFORMING WRITING MANAGEMENT IN A MEMORY DEVICE, AND ASSOCIATED MEMORY DEVICE AND CONTROLLER THEREOF

(71) Applicant: Silicon Motion Inc., Hsinchu County (TW)

(72) Inventors: Wei-Lun Yan, Hsinchu (TW); Ming-Yen Lin, Taipei (TW); Chin-Pang Chang, Taoyuan (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/547,594

(22) Filed: Aug. 22, 2019

(65) Prior Publication Data

US 2019/0377517 A1    Dec. 12, 2019

Related U.S. Application Data

(63) Continuation of application No. 16/012,782, filed on Jun. 20, 2018, now Pat. No. 10,437,520.

(30) Foreign Application Priority Data

Jan. 26, 2018  (TW) .................................. 107102826

(51) Int. Cl.
*G06F 13/00* (2006.01)
*G06F 3/06* (2006.01)
(Continued)

(52) U.S. Cl.
CPC .............. *G06F 3/0659* (2013.01); *G06F 3/06* (2013.01); *G06F 3/0604* (2013.01); *G06F 3/064* (2013.01);
(Continued)

(58) Field of Classification Search
CPC ...... G06F 3/0659; G06F 3/0604; G06F 3/064; G06F 3/0656
See application file for complete search history.

(56) References Cited

U.S. PATENT DOCUMENTS

| 7,885,112 B2 | 2/2011 | Li |
| 2010/0318720 A1 | 12/2010 | Rajagopalan |

(Continued)

FOREIGN PATENT DOCUMENTS

| CN | 101494086 B | 12/2011 |
| CN | 104699621 A | 6/2015 |

(Continued)

*Primary Examiner* — Sean D Rossiter
(74) *Attorney, Agent, or Firm* — Winston Hsu

(57) ABSTRACT

A method for performing writing management in a memory device, the memory device, and the controller thereof are provided. The method may include: writing first partial data of even-page data into a non-volatile (NV) memory; transmitting a first set of commands without a confirmation command to the NV memory, to write the first partial data and second partial data of the even-page data into an internal buffer within the NV memory; transmitting a second set of commands and the confirmation command to the NV memory, to write the first partial data and the second partial data into a block of the NV memory; writing third partial data of odd-page data into the NV memory; and writing the first and the second partial data into an even page of another block of the NV memory, and writing the third and fourth partial data into an odd page of this block.

10 Claims, 5 Drawing Sheets

(51) Int. Cl.
  *G11C 16/04*  (2006.01)
  *G11C 16/10*  (2006.01)
  *G11C 11/56*  (2006.01)

(52) U.S. Cl.
  CPC ........ *G06F 3/0656* (2013.01); *G11C 16/0483* (2013.01); *G11C 16/10* (2013.01); *G11C 11/5628* (2013.01); *G11C 11/5671* (2013.01); *G11C 2211/5641* (2013.01)

(56) References Cited

U.S. PATENT DOCUMENTS

| | | | |
|---|---|---|---|
| 2016/0085625 A1* | 3/2016 | Amato | G06F 11/108 |
| | | | 714/766 |
| 2017/0117012 A1* | 4/2017 | Ito | G06F 3/064 |
| 2018/0143877 A1* | 5/2018 | Yang | G11C 16/26 |
| 2018/0364945 A1* | 12/2018 | Tseng | G06F 3/0683 |
| 2019/0042153 A1* | 2/2019 | Khan | G06F 3/0604 |

FOREIGN PATENT DOCUMENTS

| | | |
|---|---|---|
| CN | 103377686 B | 3/2016 |
| TW | 201704996 A | 2/2017 |
| TW | 201705147 A | 2/2017 |
| TW | I590051 B | 7/2017 |
| TW | I607448 B | 12/2017 |

* cited by examiner

METHOD FOR PERFORMING WRITING MANAGEMENT IN A MEMORY DEVICE, AND ASSOCIATED MEMORY DEVICE AND CONTROLLER THEREOF

CROSS REFERENCE TO RELATED APPLICATIONS

This application is a continuation application and claims the benefit of U.S. Non-provisional application Ser. No. 16/012,782, which was filed on Jun. 20, 2018, and is included herein by reference.

BACKGROUND OF THE INVENTION

1. Field of the Invention

The present invention relates to flash memory access, and more particularly, to a method, associated apparatus and controller for performing writing management in a memory device.

2. Description of the Prior Art

Developments in memory technology have enabled the wide application of portable or non-portable memory devices (e.g. memory cards conforming to SD/MMC, CF, MS, XD and UFS specifications; and embedded storage device conforming to UFS and EMMC specifications). Improving access control of memories in these memory devices remains an issue to be solved in the art.

NAND flash memories may comprise single level cell (SLC) and multiple level cell (MLC) flash memories. In an SLC flash memory, each transistor used as a memory cell may have either of two electrical charge values: logic values 0 and 1. In comparison, the storage ability of each transistor used as a memory cell in an MLC flash memory may be fully utilized. The transistor in the MLC flash memory can be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in memory devices than an SLC flash memory. The MLC flash memory does have instability issues, however. To ensure that access control of the flash memory in the memory device meets required specifications, a controller of the flash memory is configured to apply management mechanisms for properly managing data access.

Even memory devices with the above management mechanism will have certain deficiencies, however. For example, in a situation where newer technologies are utilized on flash memory production, some design concept may cause the required buffer size of a memory device to become twice as large as the original required buffer size, and therefore a trade-off between budget control and product performance may be introduced, in which the trade-off may be regarded as a bottleneck while utilizing the newer technologies on flash memory production. Hence, there is a need for a novel method and associated architecture of memory devices which can improve memory device efficiency without introducing side effects or in a way that is less likely to introduce side effects.

SUMMARY OF THE INVENTION

One objective of the present invention is to provide a method, associated apparatus and controller for performing writing management in a memory device, in order to solve the above-mentioned problems.

Another objective of the present invention is to provide a method, an associated apparatus and a controller thereof for performing writing management in a memory device, in order to achieve optimal performance without introducing side effects or in a way that is less likely to introduce side effects.

At least one embodiment of the present invention provides a method for performing writing management in a memory device. The memory device comprises a non-volatile (NV) memory. The NV memory comprises one or more NV memory elements. Any of the one or more NV memory elements comprises multiple blocks. Any of the blocks comprises multiple pages. The method comprises: receiving a series of data from a host device, to extract even page data and odd page data from the series of data; writing first partial data of the even page data into the NV memory; transmitting a first set of commands without a confirmation command to the NV memory, to write the first partial data and second partial data of the even page data into an internal buffer of the NV memory, wherein the confirmation command is utilized for triggering the NV memory to execute at least one command to perform programming operations on at least one NV memory element of the NV memory; transmitting a second set of commands and the confirmation command to the NV memory, to write the first partial data and the second partial data into a block of the NV memory, wherein the at least one command comprises the second set of commands, and the confirmation command triggers the NV memory to execute the second set of commands; writing third partial data of the odd page data into the NV memory; and writing the first partial data and the second partial data into an even page of another block of the NV memory, and writing the third partial data and fourth partial data of the odd page data into an odd page of the another block.

At least one embodiment of the present invention provides a memory device which comprises: a non-volatile (NV) memory that is arranged to store information, wherein the NV memory comprises one or more NV memory elements, any of the one or more NV memory elements comprises multiple blocks, and any of the blocks comprises multiple pages; and a controller that is coupled to the NV memory and is arranged to control operations of the memory device. The controller comprises a processing circuit that is arranged to control the controller according to a plurality of host commands from a host device, to allow the host device to access the NV memory via the controller. For example: the controller receives a series of data from the host device to extract even page data and odd page data from the series of data; the controller writes first partial data of the even page data into the NV memory; the controller transmits a first set of commands without a confirmation command to the NV memory, to write the first partial data and second partial data of the even page data into an internal buffer of the NV memory, wherein the confirmation command is used for triggering the NV memory to execute at least one command to perform programming operations on at least one NV memory element of the NV memory; the controller transmits a second set of commands and the confirmation command to the NV memory, to write the first partial data and the second partial data into a block of the NV memory, wherein the at least one command comprises the second set of commands, and the confirmation command triggers the NV memory to execute the second set of commands; the controller writes third partial data of the odd page data into the NV memory; and the controller writes the first partial data and the second partial data into an even page of another block of the NV memory, and writes the third partial data and fourth partial data of the odd page data into an odd page of the another block.

At least one embodiment of the present invention provides a controller of a memory device, where the memory device comprises the controller and a NV memory. The NV memory comprises one or more NV memory elements, any of the one or more NV memory elements comprises multiple blocks, and any of the blocks comprises multiple pages. The controller comprises a processing circuit that is arranged to control the controller according to a plurality of host commands from a host device, to allow the host device to access the NV memory via the controller. For example: the controller receives a series of data from the host device to extract even page data and odd page data from the series of data; the controller writes first partial data of the even page data into the NV memory; the controller transmits a first set of commands without a confirmation command to the NV memory, to write the first partial data and second partial data of the even page data into an internal buffer of the NV memory, wherein the confirmation command is used for triggering the NV memory to execute at least one command to perform programming operations on at least one NV memory element of the NV memory; the controller transmits a second set of commands and the confirmation command to the NV memory, to write the first partial data and the second partial data into a block of the NV memory, wherein the at least one command comprises the second set of commands, and the confirmation command triggers the NV memory to execute the second set of commands; the controller writes third partial data of the odd page data into the NV memory; and the controller writes the first partial data and the second partial data into an even page of another block of the NV memory, and writes the third partial data and fourth partial data of the odd page data into an odd page of the another block.

By performing writing management, the present invention can properly control the operations of the controller to breakthrough the bottleneck while utilizing newer technologies on flash memory production. In addition, implementing according to the embodiments of the present invention will not greatly increase additional costs. Therefore, problems existing in the related arts can be solved without greatly increasing the overall cost. In comparison with the related art, the present invention can achieve optimal performance of memory devices without introducing side effects or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

I. Memory System

Figure 1:
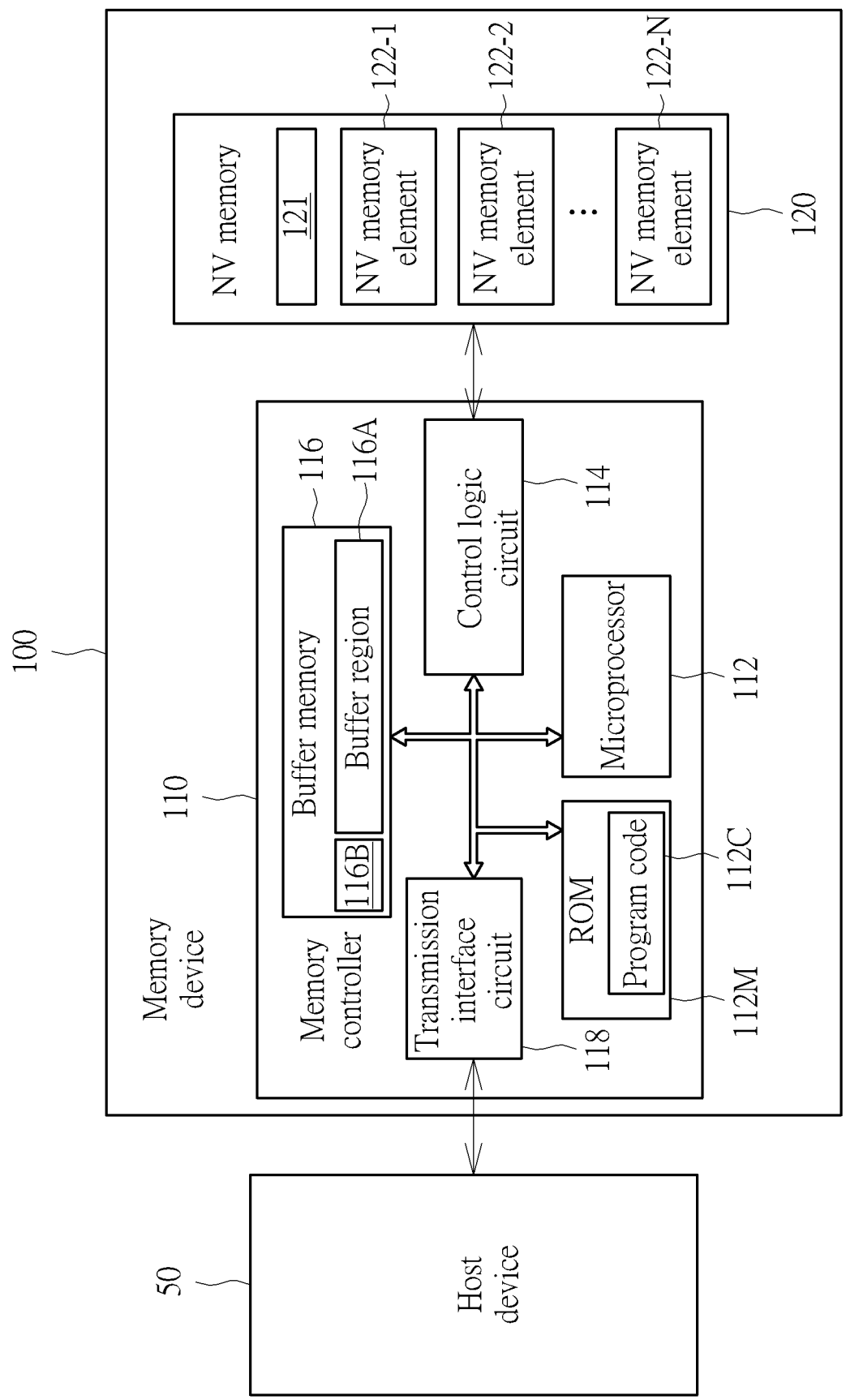
FIG. 1 is a diagram illustrating a memory device and a host device according to an embodiment of the present invention.

Refer to FIG. 1, which is a diagram illustrating a memory device 100 and a host device 50 according to a first embodiment of the present invention. The memory device 100 may be a portable memory device (e.g. a memory card conforming to the SD/MMC, CF, MS or XD specification) or a solid state drive (SSD). In addition, examples of the host device 50 may include, but are not limited to: a multifunctional mobile phone, a tablet, a wearable device, and a personal computer (e.g. a desktop computer or a laptop computer). According to this embodiment, the memory device 100 may comprise a controller such as a memory controller 110, and may further comprise a non-volatile (NV) memory 120, where the controller is arranged to access the NV memory 120, and the NV memory 120 is arranged to store information. The NV memory 120 may comprise one or more NV memory elements, such as NV memory elements 122-1, 122-2, . . . , and 122-N, where the symbol "N" may represent an integer larger than 1. For example, the NV memory 120 may be a flash memory, and the NV memory elements 122-1, 122-2, . . . , and 122-N may be a plurality of flash memory chips (which may be referred to as flash chips, for brevity) or a plurality of flash memory dies (which may be referred to as flash dies, for brevity), but the present invention is not limited thereto.

As shown in FIG. 1, the memory controller 110 may comprise a processing circuit such as a microprocessor 112, a storage such as a read only memory (ROM) 112M, a control logic circuit 114, a buffer memory 116, and a transmission interface circuit 118, where these components may be coupled to one another via a bus. The buffer memory 116 is implemented with a random access memory (RAM). In addition, the ROM 112M of this embodiment is arranged to store a program code 112C, and the microprocessor 112 is arranged to execute the program code 112C in order to control access of the NV memory 120. Note that the program code 112C may also be stored in the buffer memory 116 or in any type of memory. Additionally, the control logic circuit 114 may comprise an error correction code (ECC) circuit (not shown) for protecting data and/or performing error correction, and the transmission interface circuit 118 may conform to a specific communications specification (e.g. the serial advanced technology attachment (SATA) specification, the universal serial bus (USB) specification, or the peripheral component interconnect express (PCIE) specification), and may perform communications according to the specific communications specification.

In this embodiment, the host device 50 may access the NV memory 120 in the memory device 100, indirectly, by sending a plurality of host commands and corresponding logical addresses to the memory controller 110. The memory controller 110 receives the plurality of host commands and the logical addresses, and translates the plurality of host commands to memory operating commands (simply called operating commands), and then controls the NV memory 120 to perform reading, writing/programming on memory units (e.g. data pages) having physical addresses within the NV memory 120 by the operating commands, where the physical addresses correspond to the logical addresses. For example, the memory controller may generate or update at least one logical-to-physical address mapping table to manage the relationship between the physical addresses and the logical addresses.

II. Access Control Corresponding to Block Types

In the NV memory 120, any NV memory element 122-$n$ of the NV memory elements 122-1, 122-2, ..., and 122-N (the symbol "n" may represent any integer within the interval [1, N]) within the NV memory elements 122-1, 122-2, ..., and 122-N, may comprise multiple blocks, and a block of the multiple blocks may comprise and record a specific number of pages, where the minimum unit of erasing operations (e.g. operations of erasing data) performed by the memory controller 110 on the NV memory 120 can be a page, but the present invention is not limited thereto. Regarding the access architecture of the NV memory 120, the block may comprise M word-lines {WL(0), WL(1), ..., WL(M−1)}. For example, the memory controller 110 may write information to any word-line of the block through the SLC write mode. In this situation, the word-line may comprise a single page. For another example, the memory controller 110 may write information to any word-line of the block through the MLC write mode. In this situation, the word-line may comprise at least two pages. According to some embodiments, the word-line may comprise three pages when the memory controller 110 writes information to a word-line of the block through the triple level cell (TLC) write mode.

Figure 2:
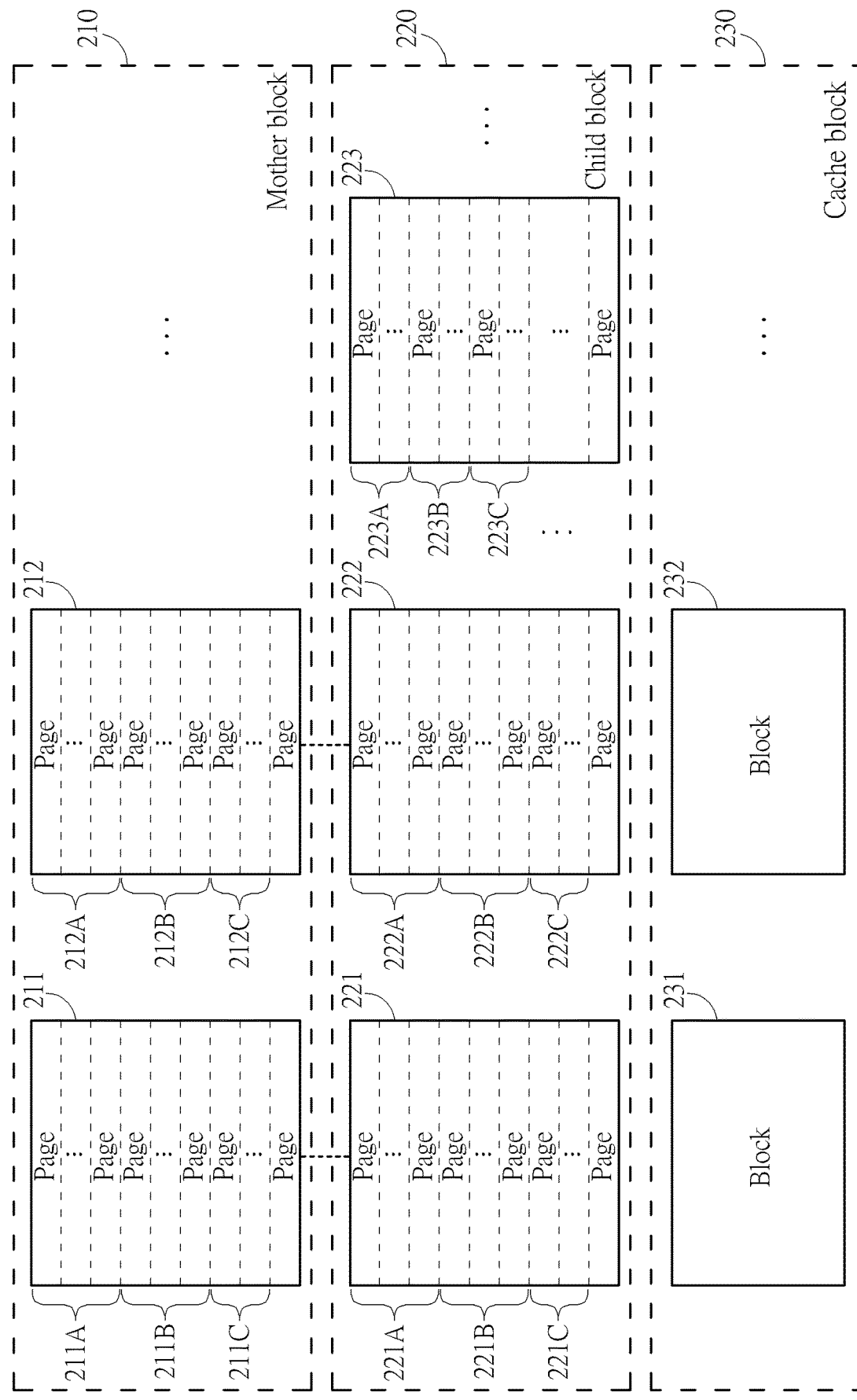
FIG. 2 illustrates a block management scheme of the memory device shown in FIG. 1 according to an embodiment of the present invention.

FIG. 2 illustrates a block management scheme of the memory device 100 shown in FIG. 1 according to an embodiment of the present invention. The memory controller 110 may classify a plurality of blocks of the NV memory 120 (e.g. the plurality of blocks comprising the respective blocks of the NV memory elements 122-1, 122-2, ..., and 122-N) into multiple types of blocks, such as mother blocks 210, child blocks 220 and cache blocks 230, and may perform corresponding control on the multiple types of blocks, respectively, to improve the performance of the memory controller 110 while accessing (e.g. reading or writing) the NV memory 120, where the type of a block may vary when needed. The memory controller 110 may select some blocks such as the blocks 231 and 232 as the cache blocks 230 for temporarily storing information, and may utilize the SLC write mode to perform a writing operation on any of these blocks to save time. In addition, the memory controller 110 may utilize the MLC write mode to perform writing operations on some blocks, to fully utilize the storage capability of these blocks, where the writing operations of both of the mother blocks 210 and the child blocks 220 may be performed through the MLC write mode. For example, the blocks 211 and 212 may be fully programmed blocks, and may belong to the mother blocks 210, where the blocks 211 and 212 may store user information, but the present invention is not limited thereto.

According to this embodiment, the host device 50 may transmit a request to the memory controller 110, for performing data updating or writing on a mother block (such as the block 211 or the block 212) through the memory controller 110, where the request may comprise a host device command and the corresponding logical address. The memory controller 110 may check whether the NV memory 120 stores any child block (such as the block 221 or the block 222) mapped to the mother block. If the child block mapped to the mother block exists in the NV memory 120, the memory controller 110 may update host write data to the child block; otherwise, the memory controller 110 may select a blank block as the child block mapped to the mother block. For example, the mother block may represent the block 211, and the child block mapped to the mother block may represent the block 221. The request may indicate that the host device 50 desires to update or write data of the subset 211B (e.g. the $10^{th}$ to the $20^{th}$ pages) of the block 211. The memory controller 110 may copy the data of the subset 211A (e.g. the $0^{th}$ to the $9^{th}$ pages) of the block 211 to the corresponding subset 221A (e.g. the $0^{th}$ to the $9^{th}$ pages) of the block 221 to make it store the copied data, and may write the host write data into the subset 221B (e.g. the $10^{th}$ to the $20^{th}$ pages) of the block 221 to make it store the updated data, in order to update or write to the locations of the same or corresponding addresses, but the present invention is not limited thereto. When needed, the memory controller 110 may copy the data of the subset 211C (e.g. the subsequent pages starting from the $21^{th}$ page) of the block 211 to the subset 221C (e.g. the subsequent pages starting from the $21^{th}$ page) of the block 221, erase the block 211 to make it become a blank block, remove the mapping relationship between the block 221 and the block 211, and update the type of the block 221 to make it belong to the mother blocks 210, where the end of the block 211 (e.g. the last page) and the end of the block 221 (e.g. the last page) may store associated management information, respectively, such as their end-of-block (EOB) information, but the present invention is not limited thereto.

In addition, the request may be replaced with a series of requests, which may indicate that the host device 50 desires to update the mother block multiple times, where the host write data can be replaced with multiple sets of host write data corresponding to the series of requests, respectively. For example, the mother block may represent the block 212, and the child block mapped to the mother block may represent the block 222. A first request of the series of requests may indicate that the host device 50 desires to update or write data of the subset 212B (e.g. the $10^{th}$ to the $20^{th}$ pages) of the block 212. The memory controller 110 may copy the data of the subset 212A (e.g. the $0^{th}$ to the $9^{th}$ pages) of the block 212 to corresponding subset 222A (e.g. the $0^{th}$ to the $9^{th}$ pages) of the block 222 to make it store the copied data, and may write the host write data corresponding to the first request to the subset 222B (e.g. the $10^{th}$ to the $20^{th}$ pages) of the block 222 to make it store the updated data, in order to update or write to the locations of the same or corresponding addresses. A second request of the series of requests may indicate that the host device 50 desires to update or write data of the subset 212B (e.g. the $10^{th}$ to the $20^{th}$ pages) of the block 212. The memory controller 110 may write the host write data corresponding to the second request to a subsequent portion within the subset 222C of the block 222, such as the portion having the same size as that of the subset 222B (e.g. the $21^{st}$ to the $31^{st}$ pages), as the replacement of the previously updated data of the subset 222B, where the previously updated data of the subset 222B may be regarded as invalid data. When needed, the memory controller 110 may perform garbage collection, and more particularly, may select a blank block, copy the data of the subset 212A (e.g. the $0^{th}$ to the $9^{th}$ pages) of the block 212 to the corresponding location (e.g. the $0^{th}$ to the $9^{th}$ pages) of this blank block, copy the data of the subsequent portion (e.g. the $21^{st}$ to the $31^{st}$ pages) within the subset 222C to the location corresponding to the subset 212B within of this blank block (e.g. the $10^{th}$ to the $20^{th}$ pages), copy the data of the subset 212C (e.g. the subsequent pages starting from the 21$^{st}$ page) of the block 212 to the corresponding location within of this blank block (e.g. the subsequent pages starting from the 21$^{st}$ page), erase the blocks 212 and 222 to make them become blank blocks, remove the mapping relationship between the block 222 and the block 212, and update the type of this blank block to make it belong to the mother blocks 210.

Additionally, the block 223 may belong to the child blocks 220, but the block 223 does not have to be mapped to any mother block. For example, in a situation where the hardware resource (such as buffer) of the host device 50 is insufficient, the host device 50 may divide continuous data (such as video data) into a huge number of small data segments (i.e. small segments of data), and transmit these small data segments, respectively. Thus, these small data segments transmitted from the host device 50 to the memory device 100 correspond to the continuous data mentioned above. The memory controller 110 may write at least one portion of these small data segments into the subsets 223A, 223B, 223C, etc. of the block 223 to make it store the written data, where each of the subsets 223A, 223B, 223C, etc. may comprise at least one page (e.g. one or more pages), and the memory controller 110 may update the type of the block 223 to make it belong to the mother blocks 210 while the block 223 is fully written, but the present invention is not limited thereto. For example, the size of each small segment of these small segments of data may be equal to 32 KB (kilobyte), and the size of each page of the block 223 may be equal to 16 KB. For another example, the size of each small segment of these small segments of data may be equal to 16 KB, and the size of each page of the block 223 may be equal to 16 KB. For yet another example, the size of each small segment of these small segments of data may be equal to 8 KB, and the size of each page of the block 223 may be equal to 16 KB. According to some embodiments, the memory controller 110 may perform buffering operation on the received small segments, to make each of the subset 223A, 223B, 223C . . . comprise a page, but the present invention is not limited thereto.

According to some embodiments, the size of the buffer region 116A of the buffet memory 116 may be greater than or equal to the data amount of the data written into the NV memory 120 at one time. When the host device 50 writes the above-mentioned continuous data (such as the video data, whose data length may be quite long) into the memory device 100, the memory controller 110 may utilize a series of child blocks that are not mapped to any mother block, such as the child block 223, to store or receive the small data segments in order to avoid extra work, such as garbage collection operations. When needed (e.g. the host write data is less than one page, where the beginning or the end need to be made up), the memory controller 110 may utilize a cache block (such as any of the cache blocks 230) to perform data writing.

III. Data Writing Management

Several types of technologies may be utilized on producing the NV memory 120, for example: 2D/planar NAND flash technology for implementing a Flash memory die in which the memory cells are arranged into a single layer within the Flash memory die; and 3D NAND flash technology for implementing a Flash memory die in which the memory cells are stacked vertically in multiple layers within the Flash memory die. According to some embodiments, the NV memory 120 may be implemented as a 2D/planar NAND flash structure with a single layer arranged memory cells. According to some embodiments, the NV memory 120 may be implemented as a 3D NAND flash structure with multiple layers of memory cells stacked vertically. For example, based on some design concept, the NV memory 120 may be designed as: while utilizing the MLC write mode to write information, it is required to write two pages of data, such as the combination data of even page plus odd page, at one time; which means, the size requirement of the buffer region 116A becomes twice (or more) as large as that of the original requirement. Assume that the hardware resource is sufficient (e.g. the total storage capacity of the buffer memory 116 is high enough), to allow the size of the buffer region 116A to reach two (or more) pages. In this situation, when the host device 50 writes the above-mentioned continuous data (such as the video data, whose data length may be quite long) into the memory device 100, the microprocessor 112 may dynamically monitor the data in the buffer region 116A, such as one or more small data segments of the small data segments, in order to accurately determine whether the one or more small data segments should be written into a cache block or a child block. For example, when the one or more small data segments are subsequent data of the previous small data segment, the microprocessor 112 may accurately determine that the one or more small data segments should be written into the child block. Therefore, the memory controller 110 may utilize the series of child blocks (such as the child block 223) to store and receive the small data segments, where the memory device 100 may have excellent write performance.

Figure 3:
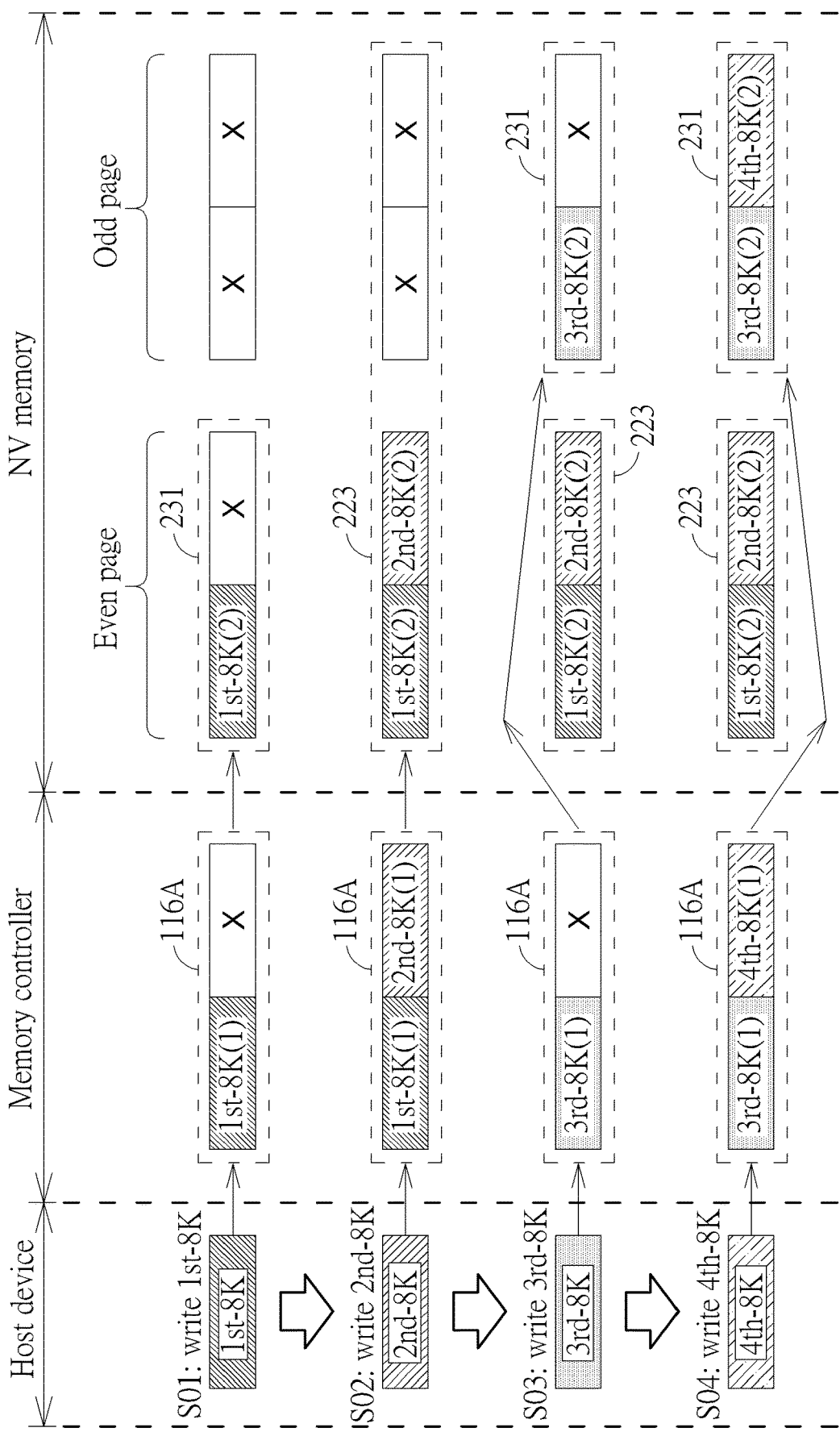
FIG. 3 is a diagram illustrating a method for performing writing management in a memory device according to an embodiment of the present invention.

Assume that the hardware resource is insufficient (e.g. the total storage capacity of the buffer memory 116 is limited), making the size of the buffer region 116A be equivalent to one page. In this situation, when the host device 50 writes the above-mentioned continuous data (such as the video data) into the memory device 100, the microprocessor 112 may not have enough information for accurately determining whether the one or more small data segments should be written into a cache block or a child block, and this may cause ineffectiveness of the above mechanism of utilizing the series of child blocks to store and receive the small data segments (e.g. the memory controller 110 may not be able to avoid extra work, such as garbage collection operations), where the writing performance may degrade. FIG. 3 is a diagram illustrating a method for performing writing management in a memory device according to an embodiment of the present invention, where the method may be applied to the memory device 100, and may be applied to the controller such as the memory controller 110. The host device 50 may be implemented as any of a video recorder, a dashboard camera, etc., but the present invention is not limited thereto. As the buffer sizes of the video recorder, the dashboard camera, etc. are limited, the above-mentioned continuous data (such as the video data) may be segmented, and more particularly, may be divided into the aforementioned small data segments. For example, the size of the video data may reach 1 MB (megabyte) or more, the size of each small segment of these small data segment may be equal to 8 KB, and the size of each page of any child block (such as the block 223) of the series of the child blocks may be equal to 16 KB.

According to this embodiment, when the even page data is fully received, through a tail process, the memory controller 110 may make the data enter an even page of a child block, and supplement or fill dummy data or other data into an odd page of the child block, such as the next page of the even page, to finish a double page writing of the child block, but the present invention is not limited thereto. The next small data segment from the host device 50 was supposed to enter the odd page of the child block, but now it can be written into a cache block only, since the odd page of the child block had been utilized through the tail process. As a result, the above mechanism of utilizing the series of child blocks to store and receive the small data segments becomes ineffective. In a situation where long time video recording is performed, the memory controller 110 may not be able to avoid extra work, such as garbage collection operations, where the writing performance may degrade.

For better understanding, data {1st-8K, 2nd-8K, 3rd-8K, 4th-8K} may be taken as examples of four continuous small data segments within the above-mentioned small data segments, data {1st-8K(1), 2nd-8K(1), 3rd-8K(1), 4th-8K(1)} represent the buffered version of the data {1st-8K, 2nd-8K, 3rd-8K, 4th-8K} that is located in the memory controller 110 (more particularly, the buffer region 116A), respectively, and data {1st-8K(2), 2nd-8K(2), 3rd-8K(2), 4th-8K(2)} represent the write-in version of the data {1st-8K, 2nd-8K, 3rd-8K, 4th-8K} that is located in the NV memory 120, respectively, where the symbol "X" may represent "don't care". The host device 50 executes Steps {S01, S02, S03, S04} sequentially to write the data {1st-8K, 2nd-8K, 3rd-8K, 4th-8K} into the memory device 100. For example, the memory controller 110 may receive a series of data such as the data {1st-8K, 2nd-8K, 3rd-8K, 4th-8K} from the host device 50, to obtain a portion of the data {1st-8K, 2nd-8K, 3rd-8K, 4th-8K} as even page data, and obtain another portion of the data {1st-8K, 2nd-8K, 3rd-8K, 4th-8K} as odd page data, but the present invention is not limited thereto. Assume that the data {1st-8K, 2nd-8K} and the data {3rd-8K, 4th-8K} are the data expected to be written into an even page and an odd page of a certain block of the NV memory 120 (e.g. the data of the $0^{th}$ page and the data of the $1^{st}$ page), respectively; which means that the data {1st-8K, 2nd-8K} and the data {3rd-8K, 4th-8K} may be regarded as the even page data and the odd page data, respectively, the data {1st-8K(1), 2nd-8K(1)} and the data {3rd-8K(1), 4th-8K(1)} may be regarded as the even page data and the odd page data, respectively, and the data {1st-8K(2), 2nd-8K(2)} and the data {3rd-8K(2), 4th-8K(2)} may be regarded as the even page data and the odd page data (labeled "even page" and "odd page" for brevity), respectively.

In response to Step S01 of the host device 50, the data 1st-8K may be stored in a first portion of the buffer region 116A as the data 1st-8K(1), and may be written into a page of the block 231 belonging to the cache blocks 230 as the data 1st-8K(2), where the size of the first portion is equal to 8 KB. For example, through the tail process, the memory controller 110 may combine the data 1st-8K(1) and dummy data having the size of 8 KB (or other data), and write the combined data into the page of the block 231. In response to Step S02 of the host device 50, the data 2nd-8K may be stored in a second portion of the buffer region 116A as the data 2nd-8K(1), for being written into the NV memory 120 as the data 2nd-8K(2), where the size of the second portion is equal to 8 KB. In this situation, the memory controller 110 has already received the even page data in the buffer region 116A, such as the data {1st-8K(1), 2nd-8K(1)}. The memory controller 110 may have detected that the host device pauses or stops transmitting data (e.g. after receiving the data 2nd-8K(1) from the host device 50, the memory controller 110 may receive a stop command from the host device 50), and at this moment, whether the next data and the data {1st-8K(1), 2nd-8K(1)} belong to the same series of the data cannot be determined, where the buffer region 116A has been fully occupied by the data {1st-8K(1), 2nd-8K(1)}. The memory controller 110 may combine the data 1st-8K(2) (obtained from the page of the block 231) and the data 2nd-8K(1) (obtained from the buffer region 116A), to utilize the combined data as the data {1st-8K(2), 2nd-8K(2)} expected to be written into an even page (e.g. the $0^{th}$ page) of the block 223 belonging to the child blocks 220. For example, through the tail process, the memory controller 110 may combine the data {1st-8K(2), 2nd-8K(2)} and dummy data having the size of 16 KB (or other data), to write the data {1st-8K(2), 2nd-8K(2)} and the above-mentioned dummy data having the size of 16 KB into the even page (e.g. the $0^{th}$ page) of the block 223 and the next page such as an odd page (e.g. the $1^{st}$ page) of the block 223, to complete a double page writing operation on this child block. In response to Step S03 of the host device 50, the data 3rd-8K may be stored in the first portion of the buffer region 116A as the data 3rd-8K(1), and may be written to another page of the block 231 as the data 3rd-8K(2). For example, through the tail process, the memory controller 110 may combine the data 3rd-8K(1) and dummy data having the size of 8 KB (or other data), and write the combined data into the above-mentioned another page of the block 231. In response to Step S04 of the host device 50, the data 4th-8K may be stored in the second portion of the buffer region 116A as the data 4th-8K(1), for being written into the NV memory 120 as the data 4th-8K(2). In this situation, the memory controller 110 has already received the odd page data in the buffer region 116A, such as the data {3rd-8K(1), 4th-8K(1)}. As the odd page (e.g. the $1^{st}$ page) of the block 223 has been utilized to store the above-mentioned dummy data having the size of 16 KB (or other data), the data {3rd-8K(2), 4th-8K(2)} are stored in the block 231, rather than the block 223. For example, the memory controller 110 may combine the data 3rd-8K(2) (obtained from the aforementioned another page of the block 231) and the data 4th-8K(1) (obtained from the buffer region 116A), to write the combined data into yet another page of the block 231 as the data {3rd-8K(2), 4th-8K(2)}. After above operations, as valid even page data (such as the data {1st-8K(2), 2nd-8K(2)}) is located in the block 223 belonging to the child blocks 220, and valid odd page data (such as the data {3rd-8K(2), 4th-8K(2)}) is located in the block 231 belonging to the cache blocks 230, the memory controller 110 may not be able to avoid extra work, such as garbage collection operations, but the present invention is not limited thereto.

According to some embodiments, in a situation where the total storage capacity of the buffer memory 116 is limited (e.g. the size of the buffer region 116A is equivalent to that of one page), the memory controller 110 may adjust (e.g. suspend, cancel, and/or revise) a portion of operating commands being applied to the NV memory 120, to prevent the valid even page data (such as {1st-8K(2), 2nd-8K(2)}) and the valid odd page data (such as {3rd-8K(2), 4th-8K(2)}) from being distributed over different types of blocks; and, the memory controller 110 can obtain enough information for accurately determine whether the one or more small data segments should be written to a cache block or a child block, to make sure the above mechanism of utilizing the child block to store and receive the small data segments is valid. For example, in a situation where the manufacture of the NV memory 120 does not provide an operating command for controlling an internal buffer 121 of the NV memory 120, the memory controller 110 may properly utilize the internal buffer 121 of the NV memory 120 through command modification, and more particularly, may transmit data to the NV memory 120 first, to temporarily store the data in the internal buffer 121. As long as the memory controller 110 does not transmit a confirmation command to the NV memory 120, the NV memory will not execute programming, so, before transmitting the confirmation command to the NV memory 120, the memory controller 110 may change a target write location of the data, for example, dynamically determine whether to change the target write location from the block 223 belonging to the child blocks 220 to the block 231 belonging to the cache blocks 230. In addition, in order to prevent the data unreadable problem caused by merely changing the target write location (e.g. the problem that the randomized version of the data cannot be de-randomized correctly), the memory controller 110 can change usage of at least one portion of space within tiny remaining storage space of the buffer memory 116 (e.g. a portion or all of the remaining storage space), to arrange a data exchange region 116B in the tiny remaining storage space (where the data exchange region 116B may have only the size of 2 KB, or even smaller), and may correct a random seed via data exchange between the data exchange region 116B and the internal buffer 121, and more particularly, perform multiple random data out operations and multiple random data in operations regarding the data to correct the random seed. Assume that the target write location is a first location of a first block (e.g. the block 223) originally, and before the data is transmitted to the NV memory 120, the memory controller 110 has randomized the data according to a first random seed in order to convert the data into a first set of randomized data as a randomized version of the data, where the first random seed corresponds to the first location of the first block (e.g. the block 223). When determining changing the target write location to a second location of a second block (e.g. the block 231), through performing the multiple random data out operations and the multiple random data in operations in turns, the memory controller 110 can de-randomize the first set of randomized data according to the first random seed to regain (e.g. recover or reproduce) the data, and can randomize the data according to a second random seed to convert the data to a second set of randomized data as another randomized version of the data, where the second random seed corresponds to the second location of the second block (e.g. the block 231). As a result, in the internal buffer 121, the first set of randomized data becomes the second set of randomized data. In this situation, the memory controller 110 may transmit the confirmation command to the NV memory 120 to trigger the NV memory 120 to program the second set of randomized data to the second location of the block 231. Similarly, when needed, the first block and the second block may vary, for example, the first block and the second block may represent the block 231 and the block 223, respectively. Therefore, without introducing the above-mentioned data unreadable problem, the memory controller 110 can arbitrarily change the target write location before transmitting the confirmation command to the NV memory 120.

Figure 4:
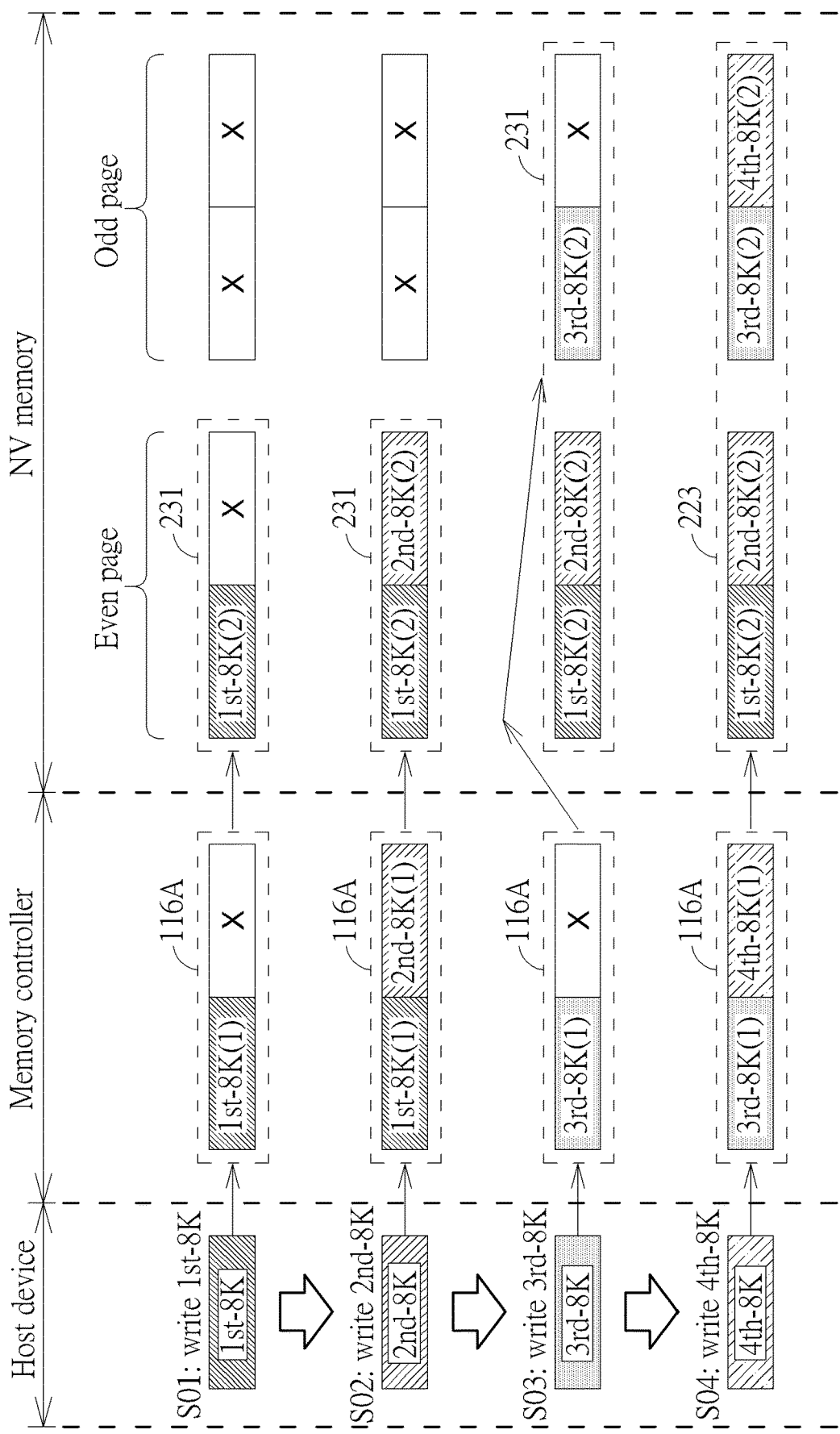
FIG. 4 is a diagram illustrating a method for performing writing management in a memory device according to another embodiment of the present invention.

As the memory controller 110 can arbitrarily change the target write location without introducing the data unreadable problem, the memory controller can prevent the problem of the embodiment shown in FIG. 3 by changing the target write location. FIG. 4 is a diagram illustrating a method for performing writing management in a memory device according to another embodiment of the present invention, where the method may be applied to the memory device 100, and may be applied to the controller such as the memory controller 110. In response to Step S01 of the host device 50, data 1st-8K may be stored in the first portion of the buffer region 116A as the data 1st-8K(1), and can be written to a page of the block 231 belonging to the cache blocks 230 as the data 1st-8K(2). For example, through the tail process, the memory controller 110 may combine the data 1st-8K(1) and dummy data having the size of 8 KB (or other data), and write the combined data into the page of the block 231. In response to Step S02 of the host device 50, the data 2nd-8K may be stored in the second portion of the buffer region 116A as the data 2nd-8K(1), for being written into the NV memory 120 as the data 2nd-8K(2). For example, through a header process, the memory controller 110 may combine the data 1st-8K(2) (obtained from the page of the block 231) and the data 2nd-8K(1) (obtained from the buffer region 116A), and transmit at least one data writing command to indicate that the memory controller desire to write the combined data into an even page of the block 223 belonging to the child blocks 220 as the data {1st-8K(2), 2nd-8K(2)}, but prevent from immediately transmitting the confirmation command to the NV memory 120, where the confirmation command may trigger the NV memory 120 execute the aforementioned at least one data writing command. The memory controller 110 may have detected that the host device pauses or stops data transmission (e.g. after receiving the data 2nd-8K(1) from the host device 50, the memory controller 110 may receive a stop command from the host device 50), an at this moment, whether the next data and the data {1st-8K(1), 2nd-8K(1)} belong to the same series of the data cannot be determined, where the buffer region 116A has been fully occupied by the data {1st-8K(1), 2nd-8K(1)}. The memory device 110 may transmit the data {1st-8K(2), 2nd-8K(2)} (more particularly, the randomized version of the data {1st-8K(2), 2nd-8K(2)} before corresponding random data out operations and corresponding random data in operations; where this randomized version can be taken as an example of the first set of randomized data) to the NV memory 120 and temporarily store it into the internal buffer 121 first, and may perform the corresponding random data out operations and the corresponding random data in operations in turns, in order to prevent the above-mentioned data unreadable problem while changing the target write location. For example, after changing the target write location, the memory controller 110 may transmit the confirmation command to the NV memory 120 to trigger the NV memory 120 programming the data {1st-8K(2), 2nd-8K(2)} (more particularly, the randomized version of the data {1st-8K(2), 2nd-8K(2)} after the corresponding random data out operations and the corresponding random data in operations; where this randomized version can be taken as an example of the second set of randomized data) to the block 231. Thus, when the next page of data (such as the data {3rd-8K(1), 4th-8K(1)}) is fully received in the buffer region 116A, the memory controller 110 can store the data belonging to the same series into the block 223 without introducing the problem that the block 223 is occupied by unrelated data (such as the above-mentioned dummy data having the size of 16 KB or other data).

In addition, in response to Step S03 of the host device 50, the data 3rd-8K may be stored in the first portion of the buffer region 116A as the data 3rd-8K(1), and may be written to another page of the block 231 as the data 3rd-8K(2). For example, through the tail process, the memory controller 110 may combine the data 3rd-8K(1) and dummy data having the size of 8 KB (or other data), and write the combined data into the above-mentioned another page of the block 231. In response to Step S04 of the host device 50, the data 4th-8K may be stored in the second portion of the buffer region 116A as the data 4th-8K(1), for being written into the NV memory 120 as the data 4th-8K(2). For example, through the header process, the memory controller 110 may try to combine the data 3rd-8K(2) (obtained from the page of the block 231) and the data 4th-8K(1) (obtained from the buffer region 116A), and detect that the data {1st-8K(2), 2nd-8K(2), 3rd-8K(2), 4th-8K(2)} belong to the same series of data, where the confirmation command has not been transmitted to NV memory 120, and the buffer region 116A is fully occupied by the data {3rd-8K(1), 4th-8K(1)}. For example, regarding the even page data, such as the data {1st-8K(2), 2nd-8K(2)} in the block 231, the memory controller 110 may perform random data out operations and random data in operations to change the random seed of the randomized version of the data {1st-8K(2), 2nd-8K(2)} to correspond to an even page (e.g. the $0^{th}$ page) of the block 223, to make it stay in the internal buffer 121. As a result, the memory controller 110 may perform the double page writing of the data {1st-8K(2), 2nd-8K(2), 3rd-8K(2), 4th-8K(2)} in the block 223, where the data {1st-8K(2), 2nd-8K(2)} are written into the even page (e.g. the $0^{th}$ page) of the block 223 and the data {3rd-8K(2), 4th-8K(2)} are written into the next page of the even page (such as the $1^{st}$ page), but the present invention is not limited thereto.

After the above operations, as the small data segments belonging to the same series of data are continuously stored in the block 223 of the child blocks 220 (e.g. valid even page data (such as the data {1st-8K(2), 2nd-8K(2)}) and valid odd page data (such as the data {3rd-8K(2), 4th-8K(2)}) are located in two continuous pages of the block 223 of the blocks 220), the memory controller 110 can prevent extra work, such as garbage collection operations, where the memory device 100 may have excellent write performance.

According to some embodiments, the size of the small data segments, the size of a page, the size of the buffer region 116A, and/or the size of the data exchange region 116B may vary. For better understanding, the aforementioned at least one data writing command may comprise a first set of commands such as the commands {0x80, Child_Addr(0), DATA(0), 0x11, 0x80, Child_Addr(1), DATA(1)}, and the confirmation command may comprise the command {0x10}, which may be regarded as a writing confirmation command, where 0x80 may represent the writing command of the MLC write mode, and may be regarded as a pre-announcing writing command for pre-announcing data writing, Child_Addr(0) may represent the physical address of the even page of the block 223 in the plane 0, DATA(0) may represent the data desired to be written (such as the data 1st-8K(2)), 0x11 may represent the plane switching command, Child_Addr(1) may represent the physical address in the even page of the block 223 in the plane 1, DATA(1) may represent the data desired to be written (such as the data 2nd-8K(1)), but the present invention is not limited thereto. Before the confirmation command (such as the command {0x10}) is transmitted, the data {DATA(0), DATA(1)} (more particularly, the randomized version thereof) may be kept to stay in the internal buffer 121, and the memory controller 110 may change the target write location through changing the address, to make the data {DATA(0), DATA(1)} be written into the block 231 (rather than 223), to prevent the block 223 from being occupied by unrelated data (such as the above-mentioned dummy data having the size of 16 KB or the other data). For example, a second set of commands corresponding to a SLC writing operation, such as the commands {0xDA, 0x85, Cache_Addr(0), 0x11, 0x85, Cache_Addr(1)}, may be included in the aforementioned at least one data writing command, where 0xDA may represent switching to the SLC write mode, 0x85 may represent the writing command of the SLC write mode, and may be regarded as a pre-announcing writing command for pre-announcing the data writing, Cache_Addr(0) may represent the physical address of a certain page of the block 231 in the plane 0, and Cache_Addr(1) may represent the physical address of this page of the block 231 in the plane 1. The memory controller 110 may transmit the first set of commands such as the commands {0x80, Child_Addr(0), DATA(0), 0x11, 0x80, Child_Addr(1), DATA(1)}, the second set of commands such as the commands {0xDA, 0x85, Cache_Addr(0), 0x11, 0x85, Cache_Addr(1)}, and the confirmation command (such as the command {0x10}), to write the data {DATA(0), DATA(1)} into the block 231 through changing/updating the address (e.g. changing/updating the address {Child_Addr(0), Child_Addr(1)} to the address {Cache_Addr(0), Cache_Addr(1)}) in the SLC write mode, but the present invention is not limited thereto. According to some embodiments, the memory controller 110 may insert at least one set of additional commands such as the commands {0x00, 0x05, 0xE0} and {0x85} between the first set of commands such as the commands {0x80, Child_Addr(0), DATA(0), 0x11, 0x80, Child_Addr(1), DATA(1)} and the second set of commands such as the commands {0xDA, 0x85, Cache_Addr(0), 0x11, 0x85, Cache_Addr(1)}, to change the random seed through the above-mentioned at least one set of additional commands, in order to guarantee the correctness and/or readability of the written data in the NV memory 120, and more particularly, prevent the randomizing/de-randomizing mechanism from being influenced by changing/updating the address, but the present invention is not limited thereto. For example, the memory controller 110 may execute the commands {0x00, 0x05, 0xE0} and {0x85} one or more times for the even pages, to perform copy-back reading and randomized data writing, in order to change the random seed that should be utilized by the randomized data in the internal buffer 121. Within the aforementioned at least one additional command, the commands {0x00, 0x05, 0xE0} and {0x85} may be regarded as the random data out command and the random data in command for performing a random data out operation and a random data in operation, respectively. As a result, the memory controller 110 may execute the commands {0x00, 0x05, 0xE0} and {0x85} multiple times to perform random data out operations and random data in operations in turns to correct the random seed. For example, when the size of the data exchange region 116B is 2 KB, the memory controller 110 may execute the commands {0x00, 0x05, 0xE0} and {0x85} on the randomized data having the size of 8 KB four times to correct its random seed.

Figure 5:
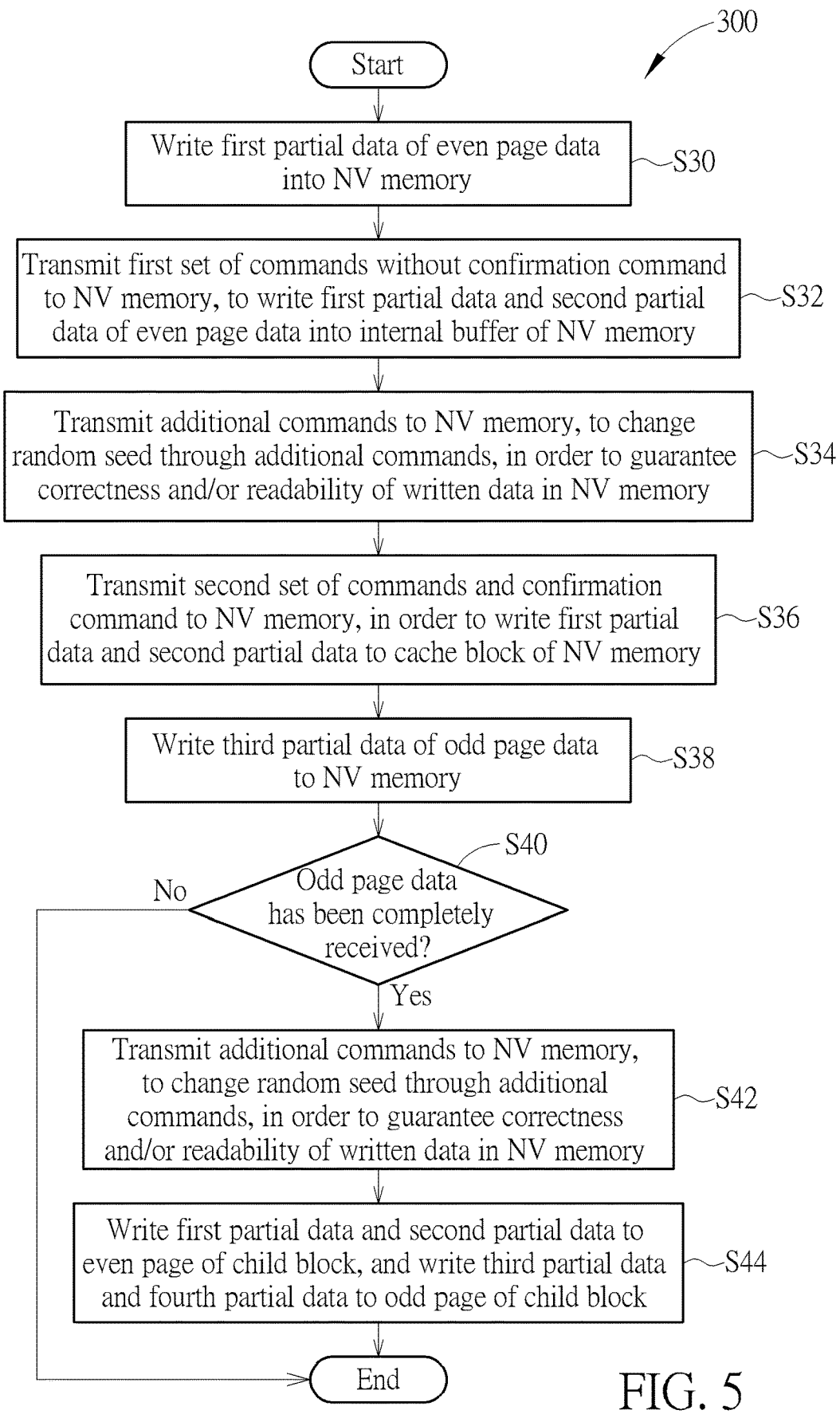
FIG. 5 illustrates a working flow of the method shown in FIG. 4 according to an embodiment of the present invention.

FIG. 5 illustrates a working flow 300 of the method shown in FIG. 4 according to an embodiment of the present invention. According to this embodiment, the memory controller 110 may receive the series of data such as the data {1st-8K, 2nd-8K, 3rd-8K, 4th-8K} to extract a portion of the series of data as the even page data and to extract another portion of the series of data as the odd page data, but the present invention is not limited thereto.

In Step S30, the memory controller 110 may write first partial data of the even page data (such as the data 1st-8K) into the NV memory 120 (e.g. the block 231 belonging to the cache blocks 230).

In Step S32, the memory controller 110 may transmit a first set of commands (e.g. the above-mentioned first set of commands such as the commands {0x80, Child_Addr(0), DATA(0), 0x11, 0x80, Child_Addr(1), DATA(1)}) without a confirmation command (such as the command {0x10}) to the NV memory 120, to write the first partial data (such as the data 1st-8K) and second partial data (such as the data 2nd-8K) of the even page data into the internal buffer 121 of the NV memory 120, where the confirmation command may be utilized for triggering the NV memory 120 to execute at least one command, such as at least one portion (e.g. a portion or all) of the aforementioned at least one data writing command to perform programming operations on at least one NV memory element (e.g. at least one of the NV memory elements 122-1, 122-2, . . . and 122-N) of the NV memory 120. For example, the first set of commands may indicate that, the NV memory 120 should write the first partial data and the second partial data to a child block of the NV memory 120, such as the block 223 belonging to child blocks 220, through the MLC write mode.

In Step S34, regarding the even page data (such as the first partial data and the second partial data), the memory controller 110 may transmit at least one set of additional commands (e.g. the aforementioned at least one set of additional command, such as the commands {0x00, 0x05, 0xE0} and {0x85}) to the NV memory 120, to change the random seed through at least one set of additional commands, in order to guarantee the correctness and/or readability of the written data in the NV memory 120. According to this embodiment, the memory controller 110 may correct the random seed of at least one portion of data in the internal buffer 121 through data exchange between the data exchange region 116B and the internal buffer 121.

In Step S36, the memory controller 110 may transmit a second set of commands (e.g. the second set of commands mentioned above, such as the commands {0xDA, 0x85, Cache_Addr(0), 0x11, 0x85, Cache_Addr(1)} and the confirmation command (such as the command {0x10})) to the NV memory 120, in order to write the first partial data and the second partial data to a cache block of the NV memory 120, such as the block 231 belonging to cache blocks 230. For example, the second set of commands may indicate that, the NV memory 120 should write the first partial data and the second partial data to the cache block through the SLC write mode. According to this embodiment, the at least one command may comprise the second set of commands, and the confirmation command triggers the NV memory 120 to execute the second set of commands, where the second set of commands may replace at least one portion (e.g. a portion or all) of the first set of commands, and may be regarded as a set of updated commands of the first set of commands. For example, the memory controller 110 does not have to re-transmit some data (such as DATA(0) and DATA(1)) to the NV memory 120, but the present invention is not limited thereto. In addition, the first set of commands and the second set of commands correspond to different target write locations, respectively. For example, the memory controller 110 may replace a first target write location designated by the first set of commands (such as the first location) with a second target location designated by the second set of commands (such as the second location) through transmitting the second set of commands. The memory controller 110 may correct the random seed of the at least one portion of data in the internal buffer 121 to comply with the second target write location.

In Step S38, the memory controller 110 may write third partial data of the odd page data (such as the data 3rd-8K) to the NV memory 120 (e.g. the block 231 belonging to the cache blocks 230).

In Step S40, the memory controller 110 may check whether the odd page data has been completely received, and more particularly, may check whether both of the third partial data (such as the data 3rd-8K) and fourth partial data (such as the data 4th-8K) of the odd page data have been received, where whether the odd page data has been completely received may correspond to whether both of the third partial data (such as the data 3rd-8K) and the fourth partial data (such as the data 4th-8K) of the odd page data have been received. For example, the memory controller 110 may check whether the fourth partial data (such as the data 4th-8K) has been received to determine whether the odd page data has been completely received. When the odd page data has been completely received (e.g. the fourth partial data (such as the data 4th-8K) has been received), Step S42 is entered; otherwise, the working flow comes to the end, but the present invention is not limited thereto.

In Step S42, regarding the even page data (such as the first partial data and the second partial data), the memory controller 110 may transmit the at least one set of additional commands (such as the commands {0x00, 0x05, 0xE0} and {0x85}) to the NV memory 120, to change the random seed through the at least one set of additional commands, in order to guarantee the correctness and/or readability of the written data in the NV memory 120.

In Step S44, the memory controller 110 may write the first partial data (such as the data 1st-8K) and the second partial data (such as the data 2nd-8K) to an even page of the child block (such as the block 223), and write the third partial data (such as the data 3rd-8K) and the fourth partial data (such as the data 4th-8K) to an odd page of the child block (such as the block 223), where the odd page is the next page of the even page.

As valid even page data (such as the data {1st-8K, 2nd-8K}) and valid odd page data (such as the data {3rd-8K, 4th-8K}) are located at two continuous pages in the block 223, the block controller 110 can have excellent writing performance, and can prevent extra work (such as garbage collection operations). For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing writing management in a memory device, the memory device comprising a non-volatile (NV) memory, the NV memory comprising one or more NV memory elements, any of the one or more NV memory elements comprising multiple blocks, any of the blocks comprising multiple pages, the method comprising:
   utilizing a buffer region in a buffer memory of the memory device to buffer a series of data received from a host device, wherein a first set of segments and a second set of segments within the series of data are utilized as even page data and odd page data, respectively;
   writing first partial data of the even page data into the NV memory, wherein the first partial data comprises at least one first segment of the first set of segments;
   transmitting a first set of commands to the NV memory, to write the first partial data and second partial data of the even page data into an internal buffer of the NV memory, rather than triggering the NV memory to perform any programming operation on any NV memory element of the NV memory, wherein the second partial data comprises at least one second segment of the first set of segments;
   transmitting a second set of commands and a confirmation command to the NV memory, to write the first partial data and the second partial data into a block of the NV memory, wherein the confirmation command triggers the NV memory to execute the second set of commands to perform corresponding programming operations on at least one NV memory element of the NV memory;

writing third partial data of the odd page data into the NV memory, wherein the third partial data comprises at least one third segment of the second set of segments; and writing the first partial data and the second partial data into an even page of another block of the NV memory, and writing the third partial data and fourth partial data of the odd page data into an odd page of the another block, wherein the fourth partial data comprises at least one fourth segment of the second set of segments.

2. The method of claim 1, wherein within the series of data, the second set of segments are subsequent segments of the first set of segments.

3. The method of claim 1, wherein within the first set of segments, the at least one second segment is at least one subsequent segment of the at least one first segment; and within the second set of segments, the at least one fourth segment is at least one subsequent segment of the at least one third segment.

4. The method of claim 1, wherein a size of each segment of the first set of segments and the second set of segments is not greater than a half of a size of the buffer region.

5. The method of claim 1, wherein the block and the another block belong to different types of blocks, respectively.

6. The method of claim 5, wherein the block represents a cache block, and the another block represents a child block.

7. The method of claim 1, wherein a target write location specified by the first set of commands is located in the another block.

8. The method of claim 1, wherein the memory device comprises a controller positioned outside the NV memory, and the controller comprises the buffer memory, wherein a size of the buffer region in the buffer memory is equivalent to that of a page.

9. A memory device, comprising:
a non-volatile (NV) memory, arranged to store information, wherein the NV memory comprises one or more NV memory elements, any of the one or more NV memory elements comprises multiple blocks, and any of the blocks comprises multiple pages; and
a controller, coupled to the NV memory, arranged to control operations of the memory device, wherein the controller comprises:
a buffer memory, arranged to temporarily store information; and
a processing circuit, arranged to control the controller according to a plurality of host commands from a host device, to allow the host device to access the NV memory via the controller, wherein:
the controller utilizes a buffer region in the buffer memory to buffer a series of data received from the host device, wherein a first set of segments and a second set of segments within the series of data are utilized as even page data and odd page data, respectively;
the controller writes first partial data of the even page data into the NV memory, wherein the first partial data comprises at least one first segment of the first set of segments;
the controller transmits a first set of commands to the NV memory, to write the first partial data and second partial data of the even page data into an internal buffer of the NV memory, rather than triggering the NV memory to perform any programming operation on any NV memory element of the NV memory, wherein the second partial data comprises at least one second segment of the first set of segments;
the controller transmits a second set of commands and a confirmation command to the NV memory, to write the first partial data and the second partial data into a block of the NV memory, wherein the confirmation command triggers the NV memory to execute the second set of commands to perform corresponding programming operations on at least one NV memory element of the NV memory;
the controller writes third partial data of the odd page data into the NV memory, wherein the third partial data comprises at least one third segment of the second set of segments; and
the controller writes the first partial data and the second partial data into an even page of another block of the NV memory, and writes the third partial data and fourth partial data of the odd page data into an odd page of the another block, wherein the fourth partial data comprises at least one fourth segment of the second set of segments.

10. A controller of a memory device, the memory device comprising the controller and a non-volatile (NV) memory, the NV memory comprising one or more NV memory elements, any of the one or more NV memory elements comprising multiple blocks, any of the blocks comprising multiple pages, the controller comprising:
a buffer memory, arranged to temporarily store information; and
a processing circuit, arranged to control the controller according to a plurality of host commands from a host device, to allow the host device to access the NV memory via the controller, wherein:
the controller utilizes a buffer region in the buffer memory to buffer a series of data received from the host device, wherein a first set of segments and a second set of segments within the series of data are utilized as even page data and odd page data, respectively;
the controller writes first partial data of the even page data into the NV memory, wherein the first partial data comprises at least one first segment of the first set of segments;
the controller transmits a first set of commands to the NV memory, to write the first partial data and second partial data of the even page data into an internal buffer of the NV memory, rather than triggering the NV memory to perform any programming operation on any NV memory element of the NV memory, wherein the second partial data comprises at least one second segment of the first set of segments;
the controller transmits a second set of commands and a confirmation command to the NV memory, to write the first partial data and the second partial data into a block of the NV memory, wherein the confirmation command triggers the NV memory to execute the second set of commands to perform corresponding programming operations on at least one NV memory element of the NV memory;
the controller writes third partial data of the odd page data into the NV memory, wherein the third partial data comprises at least one third segment of the second set of segments; and
the controller writes the first partial data and the second partial data into an even page of another block of the NV memory, and writes the third partial data and fourth partial data of the odd page data into an odd page of the another block, wherein the fourth partial data comprises at least one fourth segment of the second set of segments.

* * * * *